United States Patent [19]
Guthrie et al.

[11] Patent Number: 4,991,115
[45] Date of Patent: Feb. 5, 1991

[54] METHOD OF MAPPING GEOMETRIC ENTITIES FROM A CONTINUOUS PLANE TO A DISCRETE PLANE

[75] Inventors: Thomas L. Guthrie, Huntington Beach; Paul K. Stephenson, Anaheim, both of Calif.

[73] Assignee: Excellon Industries, Inc., Torrance, Calif.

[21] Appl. No.: 352,562

[22] Filed: May 16, 1989

[51] Int. Cl.⁵ .......................................... G06K 15/00
[52] U.S. Cl. ................................. 364/520; 364/200
[58] Field of Search ............................ 364/518–523, 364/852, 237.7 MS, 928.3 MS; 358/300, 302; 340/723; 346/160, 107 R, 108, 1.1

[56] References Cited
U.S. PATENT DOCUMENTS
4,620,287 10/1986 Yam .................................... 364/521

Primary Examiner—Arthur G. Evans
Attorney, Agent, or Firm—Knobbe, Martens, Olson & Bear

[57] ABSTRACT

A method for generating mask transparencies for the mass production of printed circuit boards using a laser photoplotting system includes an algorithm for mapping geometric entities from the continuous plane such as is used in vector photoplotting to a pixel graphic representation of the geometric entities. The method reduces offset errors between rectangular entities and circular entities in phototool primitives constructed in the discrete pixel graphic system by selecting a pixel to represent the corner of the rectangular entity that is closest to the circumference of the circular entity.

5 Claims, 6 Drawing Sheets

METHOD OF MAPPING GEOMETRIC ENTITIES FROM A CONTINUOUS PLANE TO A DISCRETE PLANE

NOTICE REGARDING COPYRIGHTED SUBJECT MATTER

A portion of the disclosure of this patent document contains material which is subject to copyright protection. The copyright owner has no objection to the facsimile reproduction by anyone of the patent document or the patent disclosure in its entirety, as it appears in the Patent and Trademark Office patent file or records, but otherwise reserves all copyright rights, whatsoever.

BACKGROUND OF THE INVENTION

1. Field of the Invention

The present invention relates to the manufacture of photographic masks used in the mass production of printed circuit boards.

2. Description of the Related Art

The most common method for producing printed circuit boards is by photoetching. In this process, a printed circuit board is produced from a phenolic board, or other suitable electrically insulating substrate material, having a copper foil layer on one or both sides of the board. Printed circuit lines, component connection pads and other features are formed by selectively removing portions of the copper foil so that only the desired lines and pads remain. The copper foil is removed by exposing the foil to an etchant solution. The portions of the copper that are to remain on the board after etching are protected by a layer of etchant resistant material that generally conforms to the lines and pads to be formed. The etchant resistant material is referred to as a "photo resist."

Although the photo resist could be applied to the copper foil only where desired, typically, during the mass production of printed circuit boards, the entire copper foil layer is first coated with the photo resist. Thereafter, the undesired portions of the photo resist are removed so that only the portions of the photo resist that conform to the desired lines and pads remain. This is accomplished by selectively exposing the photo resist to light so that, for example, the portions to remain on the copper layer are exposed to light and the undesired portions are removed. The photo resist is photosensitive. That is, when the photo resist is exposed to light of appropriate wavelength (e.g., ultraviolet light) and intensity, the photo resist changes its characteristics. For example, the exposure of some photo resist materials to light makes the photo resist insoluble to a developing solution so that when the printed circuit board is immersed in the developing solution, the unexposed portions of the photo resist are dissolved, leaving only the portions that were exposed to light. Other photo resist materials respond to the light in the opposite manner such that the portions exposed to light are soluble and the unexposed portions remain after immersion in the developer.

Alternative printed circuit board processes use the photo resist as a plating mask. That is the dissolve portions of the photo resist correspond to the lines and pads of the printed circuit board. A layer of tin/lead or other protective metal is plated onto the copper at the areas where the photo resist has been removed. Thereafter, the remaining photo resist is removed. The tin/lead plated areas are protected during the etching process, whereas the unplated areas are etched away. In addition, the tin/lead plating protects the resulting copper lines and pads during the remaining manufacturing processes and makes it easier to solder components to the printed circuit boards.

In order to control the exposure of the etchant material to the light, a mask is used. The mask is positioned between the printed circuit board and a light source. The mask has patterns of opaque areas that correspond to the portions of the etchant material that are not to be exposed to light, and the remaining areas are transparent to allow the light to expose the underlying etchant resistant material. Masks can have either positive patterns where the lines and pads are represented by opaque areas or negative patterns where the lines and pads are represented by the transparent areas. The choice of either positive or negative patterns is determined by the type of etchant material used or further processing to be performed during the manufacture of the printed circuit board.

As set forth above, a mask is similar to a transparency in that it comprises opaque and transparent sections which regulate the position and amount of light that can pass from a light source to the photo resist on a printed circuit board. The mask transparency, which can be either a photopositive or a photonegative, as discussed above, can be constructed in many ways. For example, until recently masks were constructed by draftsmen using layout tape. Typically, a draftsman would create a representation of the mask that was two or more times as large as the final mask transparency. This representation was photographed to produce a mask transparency of the proper size. It can readily be understood that this was inherently a time-consuming and inaccurate process.

More recently, the production of masks for printed circuit boards has been automated using computer aided design (CAD) to determine the placements of connection pads and other features on printed circuit boards and the routing of lines between the pads and other features. The output of the CAD system is routed to a laser photoplotter that generates a photopositive or photonegative image directly onto a mask transparency film by selectively exposing the photosensitive surface of the mask transparency film to a beam of light from a laser light source. The laser photoplotter operates in a manner similar to a television in that the laser beam is caused to scan across the surface of the mask transparency film in a raster scan pattern (e.g., across the film horizontally for each line and vertically from line to line). As the laser beam is scanned, the laser is turned on and off to selectively expose the mask transparency film to create the representations of the lines, pads and other features.

Since the laser photoplotters basically operate on a pixel format similar to the pixels used to create images on a video monitor and similar to the pixels used to create images on a laser printer, or the like, the resulting mask transparency can be considered to comprise a plurality of dots of exposed film. Depending upon the resolution of the laser photoplotter, the dots for horizontal and vertical lines will appear as continuous lines of uniform width. On the other hand, diagonal lines and circular features may appear jagged when viewed under a microscope.

A further characteristic of laser photoplotters relates to the construction of composite features such as the intersection between two lines, or the like. It should be understood that the databases used in the creation of printed circuit board masks were developed when vector photoplotters were the dominant systems for generating mask transparencies. Such vector photoplotters move a light source from point to point in order to create lines and other features. In addition, the widths of lines and the sizes of other features are controlled by changing the sizes and shapes of apertures between the light source and the mask transparency film and by changing the intensity of the light from the source. Thus, the vector photoplotter can be considered to be a continuous domain plotter in that virtually any pattern can be created on the mask transparency.

In order to be compatible with the pixel format of the laser photoplotter, the data from the vector format databases must be rasterized. That is, the individual lines, circles and other shapes generated for the vector photoplotters must be converted into a series of dots that represent the lines and other features. The dots correspond to pixels and the number of dots per unit area is limited by the resolution of the laser photoplotter. This conversion from the continuous domain of the vector photoplotter database to the discrete domain of the laser photoplotter inherently causes a laser photoplotter to have inaccuracies since the exposure by the laser beam is provided on a pixel by pixel basis. In particular, many of the lines and features to be plotted fail to correspond to the centers of the available pixels. Thus, the software that converts the vector database information to a raster database for plotting by a laser photoplotter must necessarily select pixels that best represent the features to be plotted. This is a particularly difficult problem when a horizontal or vertical line intersects with a line that is neither horizontal or vertical (e.g., a line at 45°). The resulting intersections often exhibit bumps and shifting of the lines proximate to the intersection. Such bumps and shifting are generally unavoidable using conventional rasterizing software, particularly when the line widths are very small. A need exists for a method to reduce the inaccuracies in rasterizing intersecting lines for mask transparencies.

SUMMARY OF THE INVENTION

The present invention is an improved method for mapping vector information from a vector photoplotting database into discrete pixels for plotting using a laser photoplotter or the like. The lines from vector photoplotting database are constructed as circles at the two ends of each line with a rectangle interconnecting the circles. The positioning of each corner of a rectangle with respect to the periphery of a circle is accomplished by selecting a pixel that best represents the terminus of a line tangential to the periphery of the circle. Rather than selecting the pixel that is nearest to the endpoint of the radius of the circle in a conventional manner, the method of the present invention selects the pixel proximate to the endpoint that is nearest to the periphery of the circle. By selecting the pixel in accordance with the method of the present invention, the bumps and shifting of the lines proximate to intersections are substantially reduced.

In other words, the present invention is a method of selecting a pixel to represent the intersection a circumference of a circle with a tangential line in a laser photoplotting system having a pixel coordinate system of fixed pixel resolution when the laser photoplotting system receives data representing the line and the circle in a non-pixel coordinate system having a higher resolution than the fixed pixel resolution of the laser photoplotting system. The method includes the step of defining a set of pixels in the pixel coordinate system closest to the point. Thereafter, the method selects a pixel from the set of pixels whose distance from the center of the circle is closest to the radial distance of the point from the center of the circle.

DETAILED DESCRIPTION OF THE PREFERRED EMBODIMENT

Figure 1:
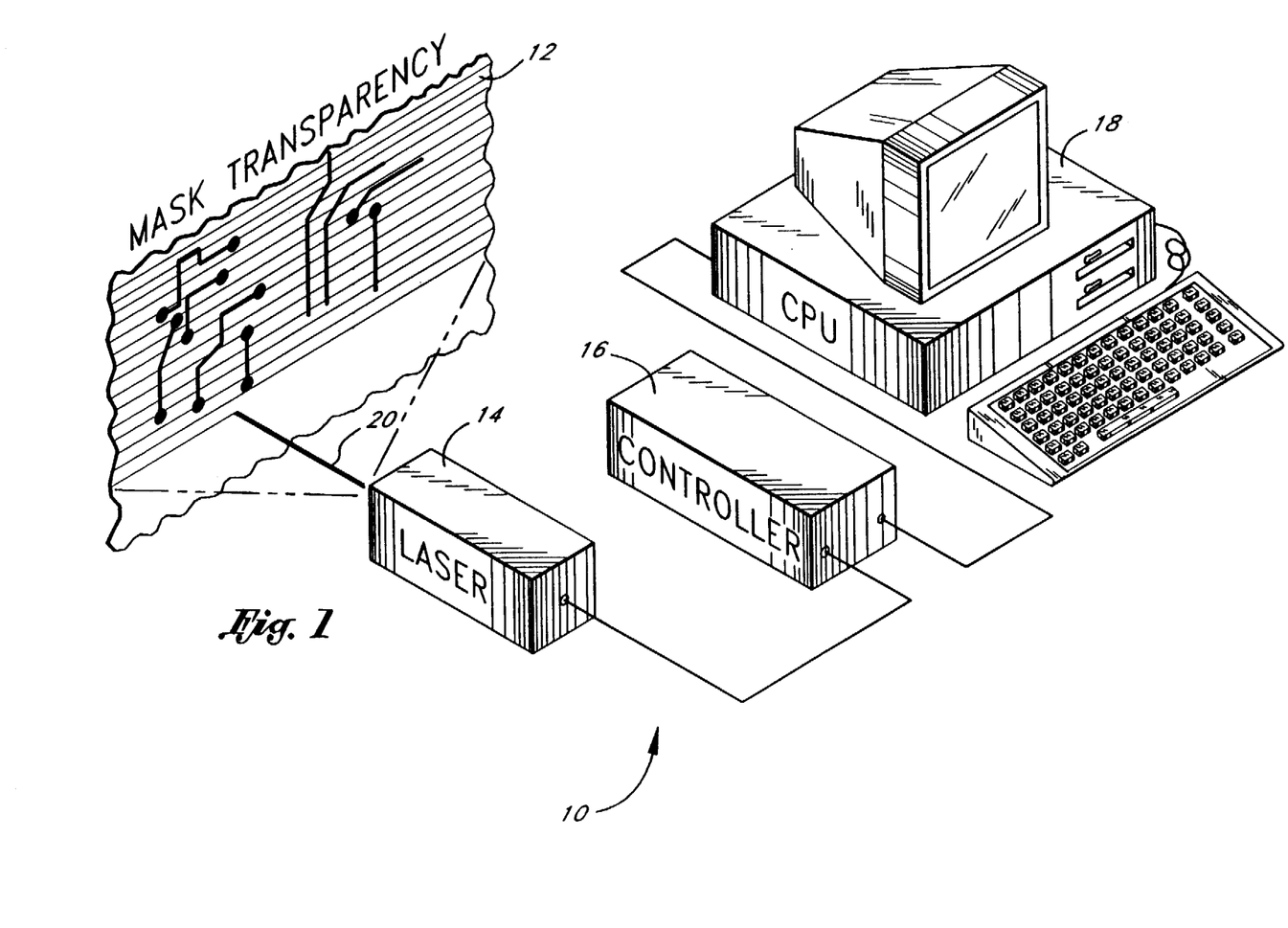
FIG. 1 schematically illustrates the operation of a laser photoplotting system showing a laser light beam scanning a mask transparency film.

FIG. 1 pictorially illustrates the operation of an exemplary laser photoplotter 10 in producing an exemplary printed circuit board mask transparency 12. As illustrated, the photoplotter 10 includes a laser 14 which is controlled by a laser controller 16, which is in turn controlled by a computer (CPU) 18. The operation of a photoplotter such as the photoplotter 10 is well-known in the art and will not be described in detail herein. Basically, the controller 16 causes a laser light beam 20 emitted by the laser 14 to be scanned across the surface of the mask transparency 12 in a raster-scan fashion (i.e., the laser beam 20 moves horizontally across the surface of the mask transparency 12 one line at a time in a manner similar to the raster-scan of a conventional cathode ray tube in a video monitor, a television, or the like). For example, as is well known in the art, the laser 14 advantageously includes a modulator and a rotating octagonal mirror for controlling the intensity and the horizontal position of the laser beam 20 as the mask transparency 12 is moved vertically with respect to the laser beam 20. (It should be understood of course that vertical and horizontal refer to the orientation of FIG. 1. In an exemplary laser photoplotter, the mask transparency 12 is supported on a horizontally disposed flat bed and is physically moved in a horizontal direction while the laser beam 20 scans the mask transparency 12 in a direction generally orthogonal to the movement of the mask transparency 12.)

As the laser beam 20 scans the surface of the mask transparency 12, the laser beam 20 is selectively turned on and turned off to selectively determine which portions of the surface of the mask transparency 12 are exposed to the laser light beam 20. Each discrete location on the mask transparency that can be selectively exposed is referred to as a pixel. The mask transparency provides a permanent record of the pixels that have been illuminated. As is well known in digital graphics systems, such pixels form an X-Y grid or coordinate plane, and images are formed by turning pixels on or off. The number of pixels per unit length in each of the X and Y coordinate directions is referred to as the resolution of the graphics system. For example, the resolution of an exemplary laser photoplotting system may be in the range of 1-8 pixels per mil (i.e., 1-8 pixels per 0.001 inch).

As is well-known in the art, the mask transparency 12 typically comprises a transparent substrate, such as mylar or glass, having a photosensitive coating, such as silver halide, on one surface. When the mask transparency 12 is exposed to the laser light beam 20 from the laser 14, the portions of the photosensitive coating exposed to the laser light beam 20 undergo a chemical transformation so, that when the mask transparency 12 is developed in a developing solution, the exposed portions remain on the surface of the mask transparency 12 as opaque areas, and the unexposed portions are removed so that light can pass through the transparent substrate. The resulting mask transparency 12 is referred to as a phototool.

The laser light beam 20 is turned on and off in response to data input transmitted from the computer 18 to the controller 16. By selectively controlling the data sent to the controller 16, the computer 18 can cause a pattern of rectangles, circles and other geometric entities to be formed on the mask transparency 12 as illustrated in FIG. 1. An enlarged portion of the surface of the mask transparency 12 is illustrated in FIG. 2 to more clearly show a number of such geometric entities that comprise interconnecting lines and pads.

As discussed above, after the mask transparency 12 is developed, the mask transparency 12 is used to mass produce printed circuit boards (not shown) in a conventional manner. In FIGS. 1 and 2, the interconnecting lines and pads are illustrated as positive images such that a dark portion of the mask transparency 12 will cause a corresponding copper line or pad to be formed on each of the mass produced printed circuit boards. For example, a solid circle 30 represents a circular pad that may be used for soldering a component lead to the printed circuit board constructed using the mask transparency 12. As further illustrated, a line 32 represents a portion of a line that will provide an electrically conductive path on the printed circuit board.

The present invention relates to the generation of data by the computer 18 that is to be transmitted to the controller 16. In particular, the present invention concerns the generation of an optimal set of data so that the rectangles, circles and other geometric entities formed by the raster scan of the laser beam 20 are properly aligned with each other so as to form a composite entity that appears to be a single, seamless entity, such as an interconnecting line segment. Such entities are referred to as phototool primitives.

Figures 2, 3:
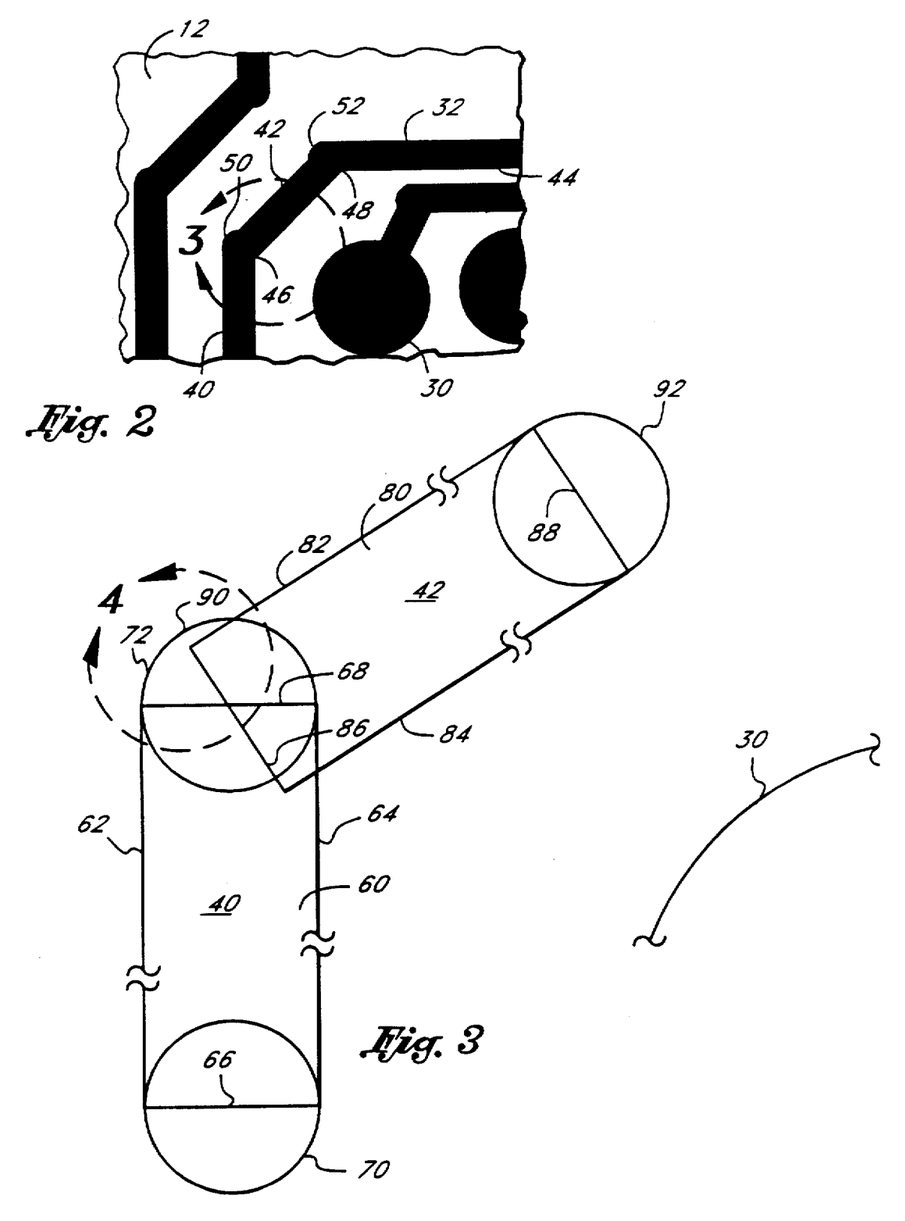
FIG. 2 is an enlarged plan view of a small portion of the positive mask transparency of FIG. 1 showing the intersection of two lines at a 45° angle and further showing a bump at the intersection resulting from conventional digitization of the lines.
FIG. 3 is a pictorial representation of a conventional digitized image of the two lines in FIG. 2 showing the circular and rectangular geometric entities used to construct the two lines, and further showing the offset from the rectangular entity of the 45° line and the periphery of the circular entity of the 45° line.

The enlarged portion of the mask transparency 12 shown in FIG. 2 illustrates an existing problem with conventional laser photoplotting systems. As previously discussed, the data that is generated by exemplary computer aided design systems for printed circuit board applications, is generated assuming that the data will be used to control a vector photoplotting system which generally operates in a continuous manner. That is, the resolution of a typical vector photoplotting system is such that lines, pads and other entities can be positioned with very fine precision. Thus, the circles, rectangles and other entities that form interconnecting lines, or the like, frequently begin or end on boundaries that do not correspond to the discrete locations of pixels generated on the mask transparency 12 by the laser light beam 20 in FIG. 1.

In order to illustrate the problem that results from the digitization of the geometric entities that comprise the lines on the masks, the line 32 in FIG. 2 will be described in more detail. As illustrated, the line 32 comprises a first vertical line segment 40, a second diagonal line segment 42 and a third horizontal line segment 44. The first and second line segments meet at a first intersection 46, and the second and third line segments meet at a second intersection 48. Although the first and second intersections 46, 48 would be expected to have regular 45° boundaries, it can be seen that the first intersection 46 has a first bump 50 on it. Similarly, the second intersection 48 has a second bump 52 on it. While the appearances of the bumps 50, 52 indicate the possibility of a spacing violation, generally such violations are not caused by the bumps. Rather, as will be illustrated below in connection with FIG. 3, the bump 50, for example, is a portion of the circumference of a circular entity which is properly placed. The appearance of the bump 50 leads to the conclusion that the line segment 42 is shifted from its desired position such that it is closer to the solid circle 30, which, in an extreme case, could lead to a design rule violation.

Thus, it can be seen that bumps and reduced line spacings are two undesirable consequences of non-tangent circle-to-rectangle registration. The bumps are cosmetic problems that are easily detectable by potential customers of laser photoplotting systems and mask transparencies generated therefrom. Such customers may judge the products less desirable because of the bumps. The reduction of entity-to-entity spacing may result in slightly reduced yields during the fabrication of printed circuit boards from the mask transparencies. Although unlikely, in an extreme case, the reduced line spacing can result in the rejection of a mask transparency because of a violation of minimum spacing rules.

In order to best understand how the present invention operates to eliminate or reduce the size of the bumps 50, 52, it is first necessary to understand the source of the bumps 50, 52. This is illustrated for the bump 50 in FIG. 3. FIG. 3 illustrates pictorial representations of the geometric entities used to generate the graphic images of the first line segment 40 and the second line segment 42. As illustrated, the first vertical line segment 40 is represented by a rectangle 60, only part of which is shown in FIG. 3. The rectangle 60 has a first long side 62, a second long side 64, a first short side 66 and a second short side 68. The first short side 66 of the rectangle 60 generally coincides with a diameter of a first circle 70, and the second short side 68 of the rectangle 60 generally coincides with a diameter of a second circle 72. Together, the rectangle 60 and the two circles 70 and 72 comprise a geometric entity or phototool primitive that defines the first line segment 40 to be exposed on the mask transparency 12, as described above.

The second 45° line segment 42 is represented by a rectangle 80, only part of which is shown in FIG. 3. The rectangle 80 has a first long side 82, a second long side 84, a first short side 86 and a second short side 88. The first short side 86 of the rectangle 80 generally coincides with a diameter of a first circle 90, and the second short side 88 of the rectangle 80 generally coincides with a diameter of a second circle 92. Together, the rectangle 80 and the two circles 90 and 92 comprise a geometric entity or phototool primitive that defines the second line segment 42 to be exposed on the mask transparency 12, as described above.

As illustrated, the second circle 72 of the first line segment 40 and the first circle 90 of the second line segment 42 coincide so that the two circles appear as a single circle. The purpose of the circles at each end of the rectangular line segments is to provide a smooth transition between the line segments. However, it can be seen in FIG. 3, that although the two circles 72, 90 generally coincide, the long sides of the rectangles forming the boundaries of the long portions of the line segments are not necessarily tangential to the circles. This is particularly evident with respect to the geometric entities representing the second 45° line segment 42. One skilled in the art will recognize that the representation of the 45° lines defining the boundaries of the rectangle 80 is limited by the pixel resolution of the laser photoplotting system. In particular, it is very likely that the corner of the rectangle 80 at the intersection of the first short side 86 and the first long side 82 will not coincide with a pixel location of the system.

Figure 4:
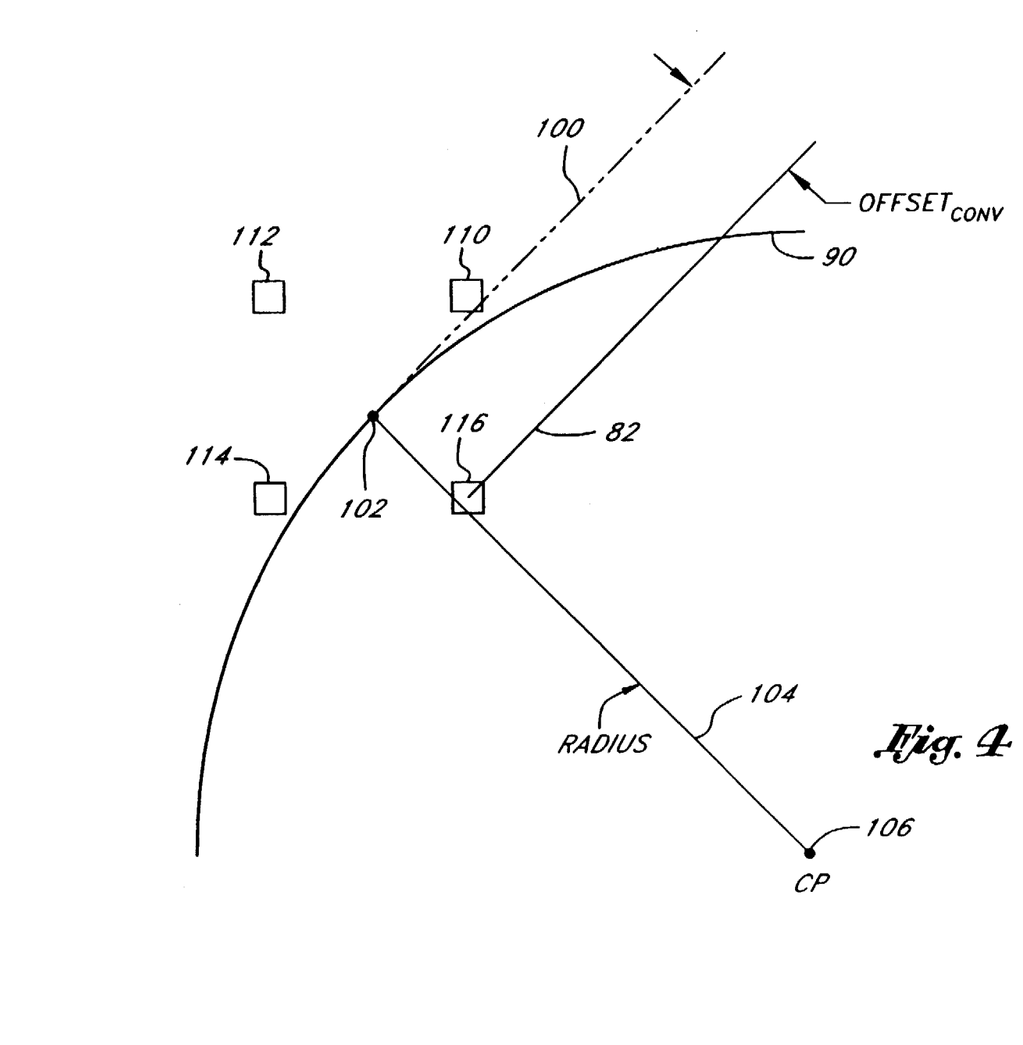
FIG. 4 is an enlarged pictorial representation of the digitized image of FIG. 3 showing the four pixels that can be selected to represent the corner of the rectangular entity, showing the boundary of the rectangular entity resulting from the selection of the corner pixel in a conventional manner, and showing the offset from the boundary of the rectangular entity to an ideal 45° line tangential to circular entity.

The foregoing is shown more clearly in FIG. 4, wherein a portion of the graphic representation proximate to the intersection of the first long side 82 and the first short side 86 is enlarged to show the pixels available to represent the intersection. A segment of the first circle 90 is shown along with a phantom line 100 that represents the ideal first long side 82 of the rectangle 80. As illustrated, an ideal point (IP) 102 is positioned on the circle 90 and represents the calculated point at which the phantom line 100 tangentially intersects the circle 90 at a radial line vector 104 having a length RADIUS from a calculated center point (CP) 106 of the circle 90. The calculated center point 106 of the circle 90 and the calculated ideal point 102 assume a continuous drawing domain and thus have coordinates that may include any numbers that can be represented by the calculation precision of the computer 18. However, as further illustrated in FIG. 4, the coordinates of the calculated ideal point 102 typically do not coincide with any of the available pixels of the laser photoplotting system. Rather, the calculated ideal point 102 lies within a square bounded by four pixels, an upper right (UR) pixel 110, an upper left (UL) pixel 112, a lower left (LL) pixel 114 and a lower right (LR) pixel 116. One of the four boundary pixels must be selected to represent the corner of the rectangle 80. In known conventional laser photoplotting systems, the boundary pixel closest to the calculated ideal point 102 is selected to represent the ideal point 102 and thus to represent the corner of the rectangle 80. For example, in FIG. 4, the lower right pixel 116 is closer to the ideal point 102 than any of the other three boundary pixels, and for the example shown, a conventional photoplotting system would select the lower right pixel 116 to represent the corner of the rectangle 80. As further illustrated in FIG. 4, the selection of the lower right pixel 116 causes the first long side 82 of the rectangle 80 to be offset by a considerable distance, indicated by $OFFSET_{CONV}$, from the ideal phantom line 100, thus causing the bump 50 shown in FIG. 2. With the upper endpoint of the second short side 86 of the rectangle 80 placed nearer to the center point 106 of the circle 90 by the amount $OFFSET_{CONV}$, it can be seen that the lower endpoint of the short side 86, and thus the long side 84, as well, will be offset from the center point 106 by a similar amount. This positions the second long side 84 closer to the perimeter of the circle 30 than intended.

Figure 5:
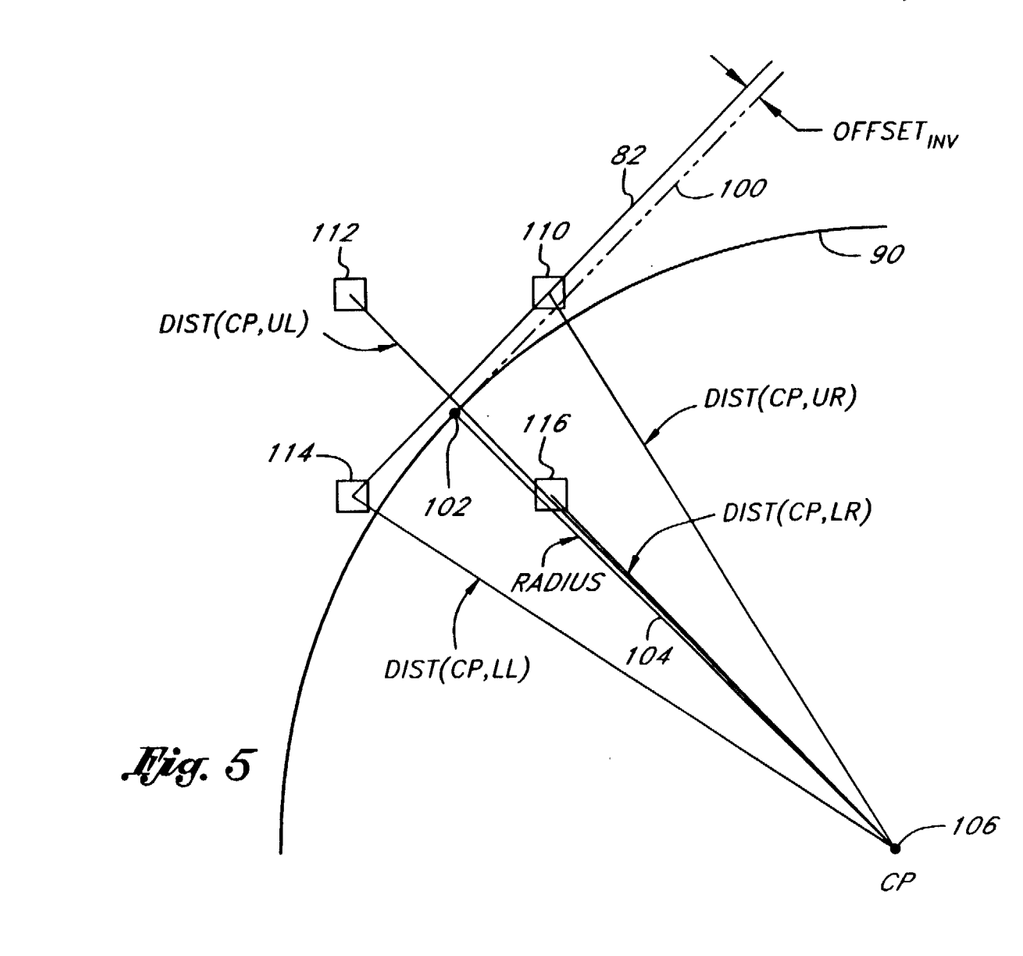
FIG. 5 is an enlarged pictorial representation of the digitized image of FIG. 4 again showing the four pixels that can be selected to represent the corner of the rectangular entity, but illustrating the selection of the corner pixel in accordance with the present invention to provide a small offset from the boundary of the rectangular entity to the ideal 45° line tangential to circular entity.

Referring now to FIG. 5, it can be seen how the pixel selection method of the present invention solves the problem caused by the conventional pixel selection method. Rather than select the pixel closest to the ideal point 102, the method of the present invention selects a pixel that is closest to the circumference of the first circle 90. This selection is accomplished by calculating the distance from each of the four boundary pixels 110, 112, 114, 116 to the center of the circle 90. The distance from the calculated center point 106 to the calculated ideal point 102 is defined as the RADIUS of the circle 90. The distance from the upper right pixel 110 to the center point 106 is identified as DIST(CP,UR). The distance from the upper left pixel 112 to the center point 106 is identified as DIST(CP,UL). The distance from the lower left pixel 114 to the center point 106 is identified as DIST(CP,LL). The distance from the lower right pixel 116 to the center point 106 is identified as DIST(CP,LR). The distance from each of the four boundary pixels 110, 112, 114, 116 to the calculated center point 106 is compared to the RADIUS, and the pixel is selected that has the smallest differential between the calculated distance and the RADIUS. By doing so, the boundary pixel closest to the circumference of the circle 90 will be selected. In the example of FIG. 5, the lower left pixel 114 is selected. A 45° line directed from the lower left pixel 114 is illustrated as the first long side 82 of the rectangle 80. It can be seen that an offset from the first long side 82 to the ideal phantom line 100 in FIG. 5, as indicated by $OFFSET_{INV}$, is considerably smaller than the $OFFSET_{CONV}$ in FIG. 4.

Figure 6:
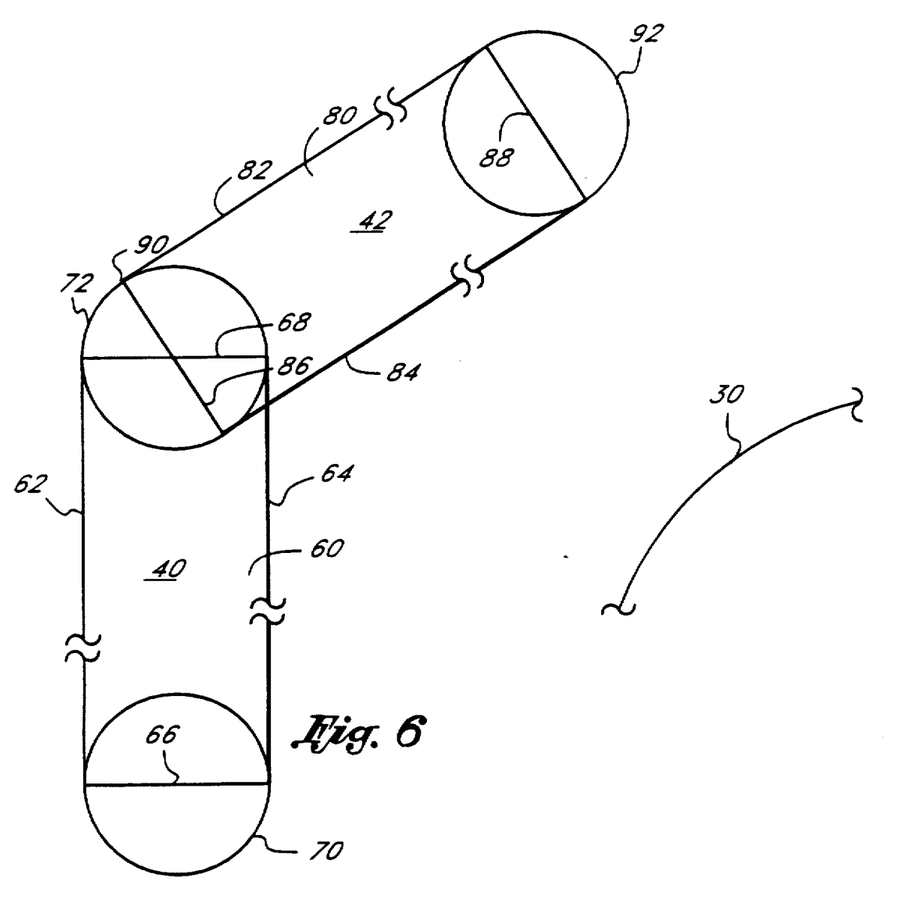
FIG. 6 is a pictorial representation of a digitized image produced in accordance with the present invention illustrating the reduced offset of the boundary of the rectangular entity from the periphery of the circular entity.
Figure 7:
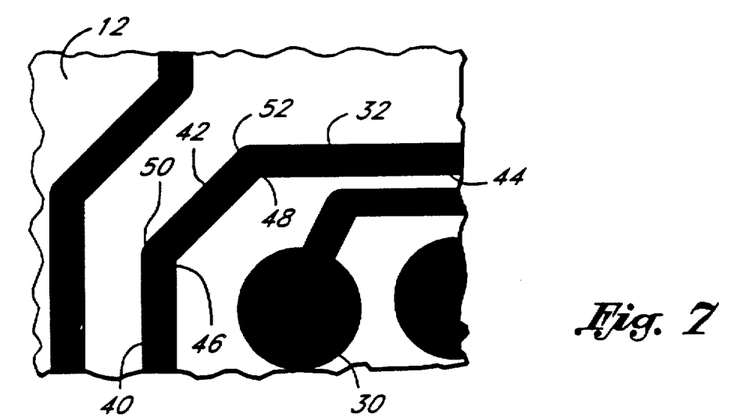
FIG. 7 is an enlarged plan view of a small portion of a positive mask transparency showing the intersection of two lines at a 45° angle similar to the view in FIG. 2, however, and showing the reduction in the size of the bump at the intersection resulting from the digitization method in accordance with the present invention.

Referring now to FIG. 6, it can be seen that the resulting geometric entity using the method of the present invention more closely conforms to an ideal geometric entity wherein the first short side 86 of the rectangle 80 corresponds to the diameter of the first circle 90. Thus, as illustrated in FIG. 7, the resulting intersection of the first line segment 40 and second line segment 42 on the mask transparency 12 has a significantly reduced bump 50 at the intersection 46 when compared to the corresponding intersection 46 in FIG. 2.

Returning to FIG. 5, in the event that two boundary pixels are equally distant from the center point 106, the present invention selects the pixel in accordance with the following counterclockwise order: the upper right pixel 110, the upper left pixel 112, the lower left pixel 114 and the lower right pixel 116. The order of selection is not critical so long as the order of selection is consistent for each selection decision. For example, a clockwise selection order can be used and a different boundary pixel can be the first pixel in the selection order.

Figure 8:
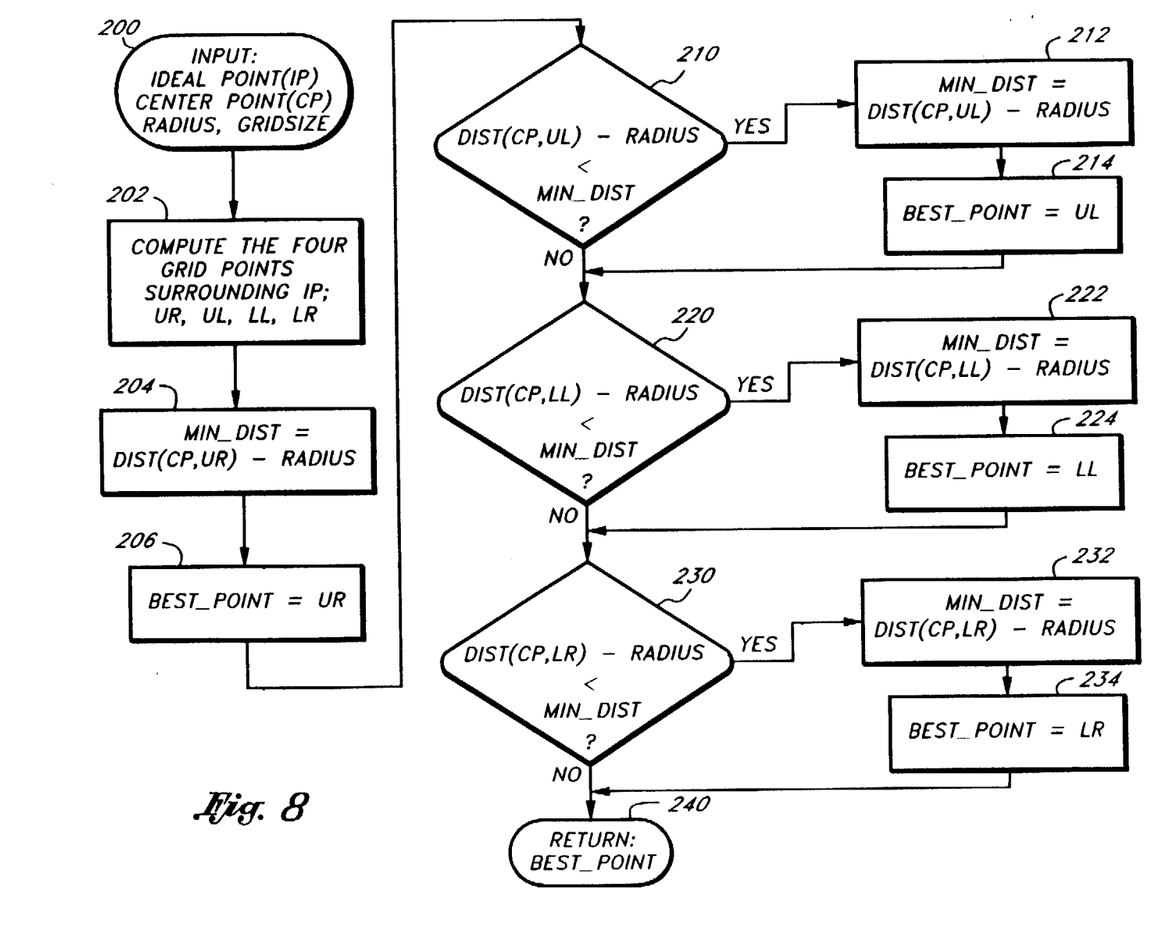
FIG. 8 illustrates a flow chart of a computer algorithm that implements the method of the present invention.

The method of the present invention can be implemented in multiple ways. In the preferred embodiment of the present invention, the method is implemented as an algorithm in the computer 18 of FIG. 1. An exemplary flow chart of the algorithm in accordance with the present invention is illustrated in FIG. 8. A particularly preferred implementation of the algorithm in the C programming language is provided at the end of the specification.

The algorithm illustrated in the flow chart of FIG. 8 receives data from other software algorithms that generate the data that defines the geometric entities to be produced by the laser photoplotting system. As illustrated by a terminal block 200 in FIG. 8, the algorithm is provided with the calculated ideal point (IP), the calculated center point (CP) of the circle, the RADIUS of the circle, and the size of the grid of the laser photoplotting system (i.e., GRIDSIZE). The GRIDSIZE defines the resolution of the laser photoplotting system and is the spacing between adjacent pixels (e.g., a four pixel per mil resolution will have a GRIDSIZE of 0.25 mil).

In a first activity block 202, the algorithm computes the four corner grid points (i.e., pixels) surrounding the ideal point (IP). Basically, the algorithm computes the number of pixels from the origin of the coordinate system to the ideal point in integer and fractional pixels in a conventional manner by dividing the calculated coordinates of the ideal point by the pixel size. For example, if the ideal point is calculated to be at the coordinate location [14.37 mils, 15.32 mils], assuming a grid size of 0.25 mils, the ideal point will be 57 and 12/25 pixels from the origin along the X axis, and will be 61 and 7/25 pixels from the origin along the Y axis. Since the ideal point cannot be represented by fractional pixels, the ideal point must be selected in accordance with one of the four closest pixels as illustrated above in FIG. 5. Assuming that the origin of the coordinate system is the lower left corner in a conventional manner, the upper right (UR) corner pixel is found by rounding both the X pixel coordinate location and the Y pixel coordinate to the next higher integer (i.e., [58, 62] in this example). The upper left (UL) corner pixel is found by rounding the X pixel coordinate to the next lower integer and rounding the Y pixel coordinate to the next higher integer (i.e., [57, 62] in this example). The lower left (LL) corner pixel is found by rounding both the X pixel coordinate and the Y pixel coordinate to the next lower integer (i.e., [57, 61] in this example). The lower right (LR) corner pixel is found by rounding the X pixel coordinate to the next higher integer and rounding the Y pixel coordinate to the next lower integer (i.e., [58, 61] in this example).

After determining the four corner pixels, the algorithm proceeds in an activity block 204, wherein the distance DIST(CP,UR) from the upper right pixel to the center point is calculated and compared to the RADIUS. The difference between the DIST(CP,UR) and the RADIUS is established as the initial minimum or shortest distance (MIN_DIST) to the circumference of the circle. It should be understood that in the activity block 204 and the others to be described below, the calculated distance is the absolute value (i.e., the unsigned magnitude) of the difference between the DIST(CP,UR) and the RADIUS. Following the activity block 204 in an activity block 206, the selected pixel, designated as BEST_POINT, is initially set to the upper right corner pixel UR. Thus, if no pixel is found that is closer to the circumference than the upper right corner pixel, the upper right corner pixel UR will be selected to represent the corner of the rectangle.

Following the activity block 206, the algorithm repeats the calculations of the distances of the RADIUS for each of the other three corner pixels. In a decision block 210, the difference between the distance DIST(CP,UL) from the upper left corner pixel to the center point and the RADIUS is calculated and compared to the calculated MIN_DIST computed for the upper right corner pixel. If the difference between the DIST(CP,UL) and the RADIUS is less than the previously calculated MIN_DIST, the algorithm proceeds from the decision block 210 to an activity block 212 wherein the newly calculated difference is substituted for the previously calculated MIN_DIST. Following the activity block 212, the algorithm enters an activity block 214 wherein the BEST_POINT is set to the upper left corner pixel UL.

Following the activity block 214, the algorithm enters a decision block 220 wherein the same calculations and comparison are performed for the lower left corner pixel LL with the comparison being made to the newly calculated MIN_DIST.

Returning to the decision block 210, if the calculated difference between the distance DIST(CP,UL) and the RADIUS is not less than the previously calculated MIN_DIST, the algorithm exits the decision block 210 directly to the decision block 220 without performing the substitutions in the activity blocks wherein the same calculation and comparison is performed for the lower left corner pixel. Thus, the comparison in the activity block 220 will be made to the original MIN_DIST calculated in the activity block 204.

If the difference between the DIST(CP,LL) and the RADIUS is less than the previously established MIN_DIST, the algorithm exits the decision block 220 to an activity block 222 wherein the MIN_DIST is set to the difference between the DIST(CP,LL) and the RADIUS. Thereafter, in an activity block 224, the BEST_POINT is set to the lower left corner pixel LL.

Following the activity block 224, the algorithm enters a decision block 230 wherein the calculations and comparison are performed for the lower right pixel LR with the comparison being made to the newly calculated MIN_DIST.

Returning to the decision block 220, if the calculated difference between the distance DIST(CP,LL) and the RADIUS is not less than the previously calculated MIN_DIST, the algorithm exits the decision block 220 directly to the decision block 230 without performing the substitutions in the activity blocks 222 and 224. Thus, the comparison in the activity block 230 will be made to the MIN_DIST that existed prior to the entry to the decision block 220.

If the difference between the DIST(CP,LR) and the RADIUS is less than the previously established MIN_DIST, the algorithm exits the decision block 230 to an activity block 232 wherein the MIN_DIST is set to the difference between the DIST(CP,LR) and the RADIUS. Thereafter, in an activity block 234, the BEST_POINT is set to the lower right corner pixel LR.

Following the activity block 234, the algorithm enters terminal block 240 wherein the algorithm returns to the software routine that called it with the selected corner pixel (i.e, the BEST_POINT) set to the lower right pixel LR.

Returning to the decision block 230, if the calculated difference between the distance DIST(CP,LR) and the RADIUS is not less than the previously calculated MIN_DIST, the algorithm exits the decision block 230 directly to the terminal block 240 without performing the substitutions in the activity blocks 232 and 234. Thus, the algorithm will return to the software routine that called it with the selected corner pixel (i.e., the BEST_POINT) set to the same BEST_POINT as when the algorithm entered the decision block 230.

From the above description, it can be seen that the algorithm will return to the calling algorithm with the BEST_POINT set to the corner pixel that is closest to the circumference of the circle (i.e., the corner pixel that is at a distance from the center point CP that is nearest to the distance of the ideal point IP from the center point CP. In the event that two corner pixels are the same distance from the center point, the BEST_POINT will be set to the first corner pixel having the minimum distance in the order of calculation presented. As set forth above, the order of the calculation can be changed so long as it is consistent whenever the algorithm is used and consistent with other pixel selection algorithms.

Referring briefly to the software listing hereinafter, it can be seen that the portion of the algorithm represented by the three decision blocks 210, 220, 230 and the associated activity blocks 212, 214, 222, 224, 232, 234 is implemented as a FOR statement to reduce the size of the software. However, it should be understood that there are alternative software implementations for the algorithm.

```
EXEMPLARY SOFTWARE FOR
ALGORITHM OF FIGURE 8

/* ************************************************* */
SUBROUTINE:    rsnap()
DESCRIPTION:
    rsnap() snaps an input point in inches to the nearest
    LPG grid location by determining the four surrounding
    grid locations and then selecting the one nearest the
    radius of the line.
    INPUTS:        RANGES:
    ip[]           input point to snap to grid
    center[]       center line
    radius         radius of line
    sysconfig      LPG config (ie. grid size)
    OUTPUTS:       RANGES:
    op[]           snapped point
 * ************************************************* /
/* ************************************************* */
    void rsnap(ip, op, center, radius, sysconfig)
/* ************************************************* */
    float          ip[],
                   op[],
                   center[],
                   radius;
    SYSCONFIG      *sysconfig;
{
    float          gp[2],
                   vector[2],
                   corner[4][2],
                   dist,
```

-continued

```
EXEMPLARY SOFTWARE FOR
ALGORITHM OF FIGURE 8 short_dist;
    int            i, index;
/* Convert ip to grid coordinates*/
    gp[0] = ip[0] / sysconfig->gridsize[0];
    gp[1] = ip[1] / sysconfig->gridsize[1];
/* Define the four surrounding grid locations*/
                   /* upper right*/
    corner[0][0] = ceil( gp[0] ) * sysconfig->gridsize[0];
    corner[0][1] = ceil( gp[1] ) * sysconfig->gridsize[1];
                   /* upper left*/
    corner[1][0] = floor( gp[0] ) * sysconfig->gridsize[0];
    corner[1][1] = ceil( gp[1] ) * sysconfig->gridsize[1];
                   /* lower left*/
    corner[2][0] = floor( gp[0] ) * sysconfig->gridsize[0];
    corner[2][1] = floor( gp[1] ) * sysconfig->gridsize[1];
                   /* lower right*/
    corner[3][0] = ceil( gp[0] ) * sysconfig->gridsize[0];
    corner[3][1] = floor( gp[1] ) * sysconfig->gridsize[1];
/* Find the surrounding grid location closest to the
   radial point */
    index = 0;
    rvsub(2, center,&(corner[0][0]), vector);
    short_dist = QUANTIZE(fabs(rvmag(2, vector) - radius));
    for ( i = 1; i < 4; i++ ) {
        rvsub(2, center, &(corner[i][0]), vector);
        dist = QUANTIZE(fabs(rvmag(2, vector) - radius));
        if ( dist < short_dist) {
            index = i;
            short_dist = dist;
        }
    }
    rvmov(2, &(corner[index][0]), op);
}
```

What is claimed is:

1. A method for generating a pixel at the corner of a rectangle generated by a laser raster-scanning photoplotter on a light sensitive material so that a side of the rectangle is substantially tangential to a circle generated by said photoplotter on said light sensitive material, said circle having a calculated center and a calculated radius in a continuous coordinate system, said method comprising the steps of:

providing an ideal location for said pixel on said light sensitive material, said ideal location being at a calculated location at said calculated radius from said calculated center of said circle in said continuous coordinate system, said ideal location being defined by a pair of orthogonal coordinate dimensions from an origin in said continuous coordinate system, said origin of said continuous coordinate system corresponding to the origin of a pixel coordinate system; and selecting a plurality of pixels to represent said pixel, said step of selecting said plurality of pixels comprising the steps of:

converting each coordinate dimension of said pair of coordinate dimensions to a number representing the number of pixels from the origin of said pixel coordinate system to said ideal location, said number comprising a whole number, and further comprising a fractional number of pixels when said coordinate dimension does not correspond to an exact number of pixels; and rounding each of said numbers that includes a fractional number of pixels to the next higher and next lower integer number of pixels to provide up to two numbers for each coordinate, each different combination of numbers representing a potential representative pixel in said pixel coordinate system;

calculating the distance from each of said potential representative pixels to said calculated center of said circle;

comparing the calculated distances of said potential representative pixels with said calculated radius to said center of said circle and selecting as said pixel at the corner of said rectangle a potential representative pixel whose distance to the calculated center of said circle is closest to said calculated radius of said circle; and outputting data representing said pixel to said laser photoplotter so that said laser photoplotter generates said corner of said rectangle on said photosensitive material.

2. The method as defined in claim 1, wherein the calculated distances of said potential representative pixels are compared with said calculated radius in a predetermined order, and wherein when more than one of said potential representative pixels have the same closest distance to said calculated radius of said circle, said selecting step selects the first of said potential representative pixels having said closest distance.

3. A method of generating a pixel at a point of intersection of a circumference of a circle with a tangential line on a light sensitive material in a laser photoplotting system having a pixel coordinate system of fixed pixel resolution when said laser photoplotting system receives data representing said line and said circle in a non-pixel coordinate system having a higher resolution than said fixed pixel resolution of said laser photoplotting system, said method comprising the steps of:

receiving data representing said circle to be formed on said light sensitive material, said data comprising a center of said circle expressed as coordinates in said non-pixel coordinate system and a radial distance from said center of said circle to said tangential line;

receiving data representing a point on said tangential line to be formed on said light sensitive material at said radial distance from said center of said circle, said data expressed as coordinates in said non-pixel coordinate system;

converting said coordinates of said point in said non-pixel coordinate system to a pair of pixel coordinates having integer and fractional pixel values;

rounding each coordinate of said pair of pixel coordinates to the next higher and next lower integer pixel values to define a set of pixels proximate to said point;

measuring the distance from each of said proximate pixels in said set to said center of said circle. and selecting a proximate pixel whose distance to said center of said circle is closest to said radial distance to represent said point; and outputting data representing said selected proximate pixel to a laser photoplotter in said laser photoplotting system so that said laser photoplotter generates said point of intersection on said light sensitive material.

4. The method as defined in claim 3, wherein said step of measuring and selecting is performed in predetermined order for said proximate pixels, and wherein if two or more pixels have the same closest distance to said radial distance, the first pixel in said predetermined order is selected to represent said point.

5. A method of generating a pixel at a point of intersection of a circumference of a circle with a tangential line on a light sensitive material in a laser photoplotting system having a pixel coordinate system of fixed pixel resolution when said laser photoplotting system receives data representing said line and said circle in a non-pixel coordinate system having a higher resolution than said fixed pixel resolution of said laser photoplotting system, said method comprising the steps of:

defining a set of pixels in said pixel coordinate system closest to said point of intersection; and selecting a pixel from said set of pixels whose distance from the center of said circle is closest to the radial distance of said point of intersection from the center of said circle; and outputting data representing said selected pixel to a laser photoplotter in said laser photoplotting system so that said laser photoplotter generates said point of intersection on said light sensitive material.

* * * * *